(12) United States Patent
Watanabe et al.

(10) Patent No.: US 9,106,215 B2
(45) Date of Patent: Aug. 11, 2015

(54) OSCILLATION STOP DETECTION CIRCUIT AND ELECTRONIC DEVICE

(71) Applicant: Seiko Instruments Inc., Chiba (JP)

(72) Inventors: Kotaro Watanabe, Chiba (JP); Makoto Mitani, Chiba (JP)

(73) Assignee: SEIKO INSTRUMANTS INC., Chiba (JP)

( * ) Notice: Subject to any disclaimer, the term of this patent is extended or adjusted under 35 U.S.C. 154(b) by 0 days.

(21) Appl. No.: 14/188,379

(22) Filed: Feb. 24, 2014

(65) Prior Publication Data

US 2014/0240054 A1    Aug. 28, 2014

(30) Foreign Application Priority Data

Feb. 25, 2013    (JP) .................................. 2013-035061

(51) Int. Cl.
*H03K 5/19*    (2006.01)
*G01R 29/02*   (2006.01)

(52) U.S. Cl.
CPC . *H03K 5/19* (2013.01); *G01R 29/02* (2013.01)

(58) Field of Classification Search
CPC .. H03B 2200/0096; G01R 29/02; H03K 5/19; H03K 5/26
USPC ................. 327/20, 142, 143, 292; 331/64, 74, 331/172–174
See application file for complete search history.

(56) References Cited

U.S. PATENT DOCUMENTS

| | | | | |
|---|---|---|---|---|
| 5,151,666 A * | 9/1992 | Tamagawa | ...................... | 331/64 |
| 5,936,452 A * | 8/1999 | Utsuno et al. | ................. | 327/292 |
| 6,163,172 A * | 12/2000 | Bazuin et al. | .................... | 326/93 |
| 6,343,334 B1 * | 1/2002 | Uemura et al. | ................... | 710/8 |
| 6,518,848 B2 * | 2/2003 | Teraishi | .......................... | 331/74 |
| 6,597,204 B2 * | 7/2003 | Imamura | ......................... | 327/20 |
| 6,668,334 B1 * | 12/2003 | Abel et al. | ..................... | 713/500 |
| 7,151,419 B2 * | 12/2006 | Hitomi et al. | ................. | 331/186 |
| 2005/0195044 A1 | 9/2005 | Hitomi et al. | | |
| 2008/0224765 A1 * | 9/2008 | Klein | ............................. | 329/312 |
| 2010/0253301 A1 * | 10/2010 | Nakada et al. | ................ | 323/282 |

FOREIGN PATENT DOCUMENTS

JP         2005-252873 A    9/2005

* cited by examiner

*Primary Examiner* — Levi Gannon
(74) *Attorney, Agent, or Firm* — Brinks Gilson & Lione

(57) ABSTRACT

Provided is an oscillation stop detection circuit having low current consumption, which is capable of detecting stop of oscillation regardless of whether an input signal stops at High or Low and thereby accurately measuring an oscillation stop detection period. The oscillation stop detection circuit includes: a pulse generation circuit for outputting a one-shot pulse in synchronization with an oscillation signal input from an input terminal; a capacitor including one terminal connected to a first power supply terminal and another terminal connected to an output terminal; a constant current circuit connected between the first power supply terminal and the another terminal of the capacitor; and a switch circuit connected between an output terminal of the pulse generation circuit and the another terminal of the capacitor, for connecting the another terminal of the capacitor to a second power supply terminal based on the one-shot pulse.

3 Claims, 5 Drawing Sheets

OSCILLATION STOP DETECTION CIRCUIT AND ELECTRONIC DEVICE

RELATED APPLICATIONS

This application claims priority under 35 U.S.C. §119 to Japanese Patent Application No. 2013-035061 filed on Feb. 25, 2013, the entire content of which is hereby incorporated by reference.

BACKGROUND OF THE INVENTION

1. Field of the Invention

The present invention relates to an oscillation stop detection circuit to be used for an electronic device including a built-in oscillation circuit, for detecting a state in which the oscillation circuit stops oscillating.

2. Description of the Related Art

Some electronic devices including a built-in oscillation circuit are provided with an oscillation stop detection circuit for determining whether the oscillation circuit is normally oscillating. When the oscillation stops, the oscillation circuit is restarted or a system is reset immediately.

FIG. 4 illustrates a circuit diagram of a related-art oscillation stop detection circuit. The related-art oscillation stop detection circuit includes inverters 10, 11, and 12, an NMOS transistor 20, a PMOS transistor 30, a capacitor 40, a positive power supply terminal 1, an input terminal 3, a constant voltage terminal 4, and an output terminal 7. An output of the inverter 10 is represented by a node B, and an input of the inverter 12 is represented by a node C.

FIG. 5 is a timing chart illustrating an operation of the related-art oscillation stop detection circuit. An oscillation signal IN is input to the input terminal 3, and a signal in anti-phase with the oscillation signal IN is output to the node B via the inverter 10. When the oscillation signal IN is Low, the node B becomes High to turn on the NMOS transistor 20, thereby charging the capacitor 40 to set the node C to Low. A constant voltage Vref is input to the constant voltage terminal 4. When the oscillation signal IN is High, the node B becomes Low to turn off the NMOS transistor 20, thereby discharging the capacitor 40 to increase the voltage at the node C. When the oscillation signal IN has the amplitudes of High and Low, the node C repeatedly charges and discharges the capacitor 40 to output a signal of High as a signal STOPX to the output terminal 7 via the inverter 12. When the oscillation signal IN stops oscillating and becomes a signal of Low, the voltage at the node C continues to increase. When the voltage at the node C exceeds an inversion level of the inverter 12, the output of the inverter 12 is inverted so that a signal of Low is output from the output terminal 7. In this manner, it can be detected that the oscillation signal IN has stopped oscillating (see, for example, Japanese Patent Application Laid-open No. 2005-252873).

In the related-art oscillation stop detection circuit, however, in the case where a signal obtained by frequency-dividing an original oscillation of the oscillation circuit by a frequency divider circuit or the like is input to the input terminal 3, there is a problem in that the stop of oscillation cannot be detected because it cannot be known whether the signal of the input terminal 3 stops at High or Low when the original oscillation of the oscillation circuit stops. Further, it is difficult to accurately measure an oscillation stop detection period that starts from the stop of the oscillation circuit and ends when a signal is output to the output terminal 7. In addition, there is another problem in that, when the input terminal 3 is Low, a current flows from the PMOS transistor 30 to the NMOS transistor 20 and an NMOS transistor of the inverter 11, resulting in large current consumption.

SUMMARY OF THE INVENTION

The present invention has been devised in order to solve the problems as described above, and realizes a technology capable of detecting stop of oscillation regardless of whether a signal at an input terminal stops at High or Low and thereby accurately measuring an oscillation stop detection period, and also reducing current consumption.

In order to solve the related-art problems, an oscillation stop detection circuit according to one embodiment of the present invention is configured as follows.

The oscillation stop detection circuit includes: an input terminal; an output terminal; a first power supply terminal; a second power supply terminal; a pulse generation circuit for outputting a one-shot pulse in synchronization with an oscillation signal input from the input terminal; a capacitor including one terminal connected to the first power supply terminal and another terminal connected to the output terminal; a constant current circuit connected to the first power supply terminal and the another terminal of the capacitor; and a switch circuit connected between an output terminal of the pulse generation circuit and the another terminal of the capacitor, for connecting the another terminal of the capacitor to the second power supply terminal based on the one-shot pulse.

According to one embodiment of the present invention, the stop of oscillation can be detected regardless of whether the input signal stops at High or Low, and thereby the oscillation stop detection period can be accurately measured, and further the current consumption can be reduced.

DETAILED DESCRIPTION OF THE PREFERRED EMBODIMENTS

Now, exemplary embodiments of the present invention are described with reference to the accompanying drawings.

Embodiments

First Embodiment

Figure 1:
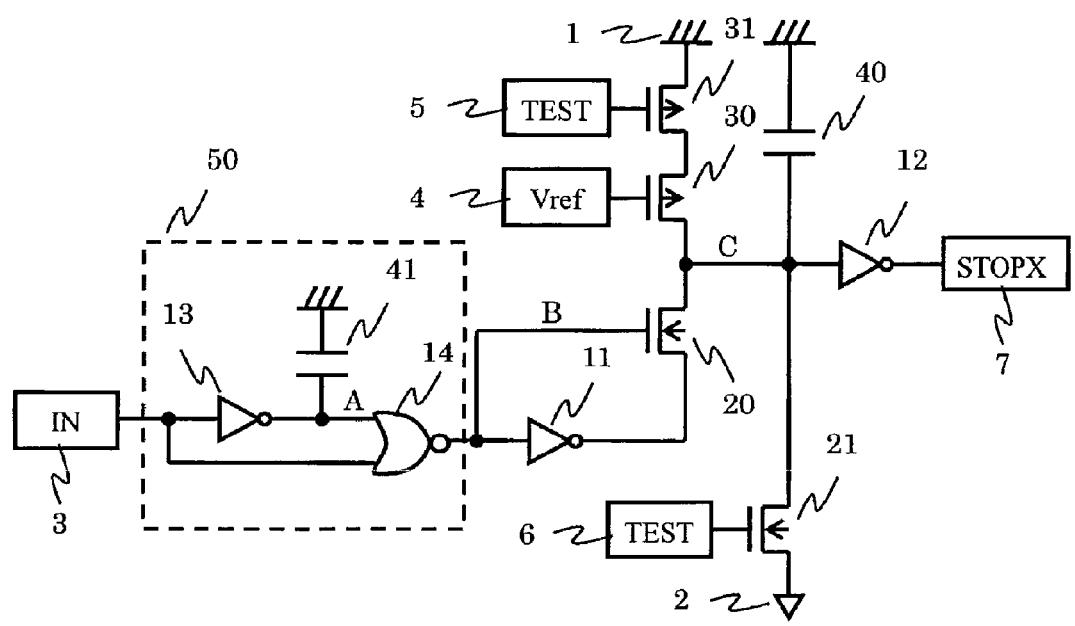
FIG. 1 is a circuit diagram of an oscillation stop detection circuit according to a first embodiment of the present invention.

FIG. 1 is a circuit diagram illustrating an oscillation stop detection circuit according to a first embodiment of the present invention. The oscillation stop detection circuit according to the first embodiment includes a pulse generation circuit 50, inverters 11 and 12, NMOS transistors 20 and 21, PMOS transistors 30 and 31, a capacitor 40, a positive power supply terminal 1, a negative power supply terminal 2, an input terminal 3, a constant voltage terminal 4, test terminals 5 and 6, and an output terminal 7. The pulse generation circuit 50 includes an inverter 13, a NOR circuit 14, and a capacitor 41. An output of the inverter 13 is represented by a node A, an output of the NOR circuit 14 is represented by a node B, and an input of the inverter 12 is represented by a node C.

The inverter 13 has an input connected to the input terminal 3, and an output connected to a first input of the NOR circuit 14 and one terminal of the capacitor 41. The capacitor 41 has the other terminal connected to the positive power supply terminal 1. The NOR circuit 14 has a second input connected to the input terminal 3, and an output connected to an input of the inverter 11 and a gate of the NMOS transistor 20. The NMOS transistor 20 has a source connected to an output of the inverter 11 and a drain connected to the input of the inverter 12. The PMOS transistor 30 has a gate connected to the constant voltage terminal 4, a source connected to a drain of the PMOS transistor 31, and a drain connected to the input of the inverter 12. The PMOS transistor 31 has a gate connected to the test terminal 5 and a source connected to the positive power supply terminal 1. The NMOS transistor 21 has a gate connected to the test terminal 6, a drain connected to the input of the inverter 12 and one terminal of the capacitor 40, and a source connected to the negative power supply terminal 2. The capacitor 40 has the other terminal connected to the positive power supply terminal 1. The inverter 12 has an output connected to the output terminal 7.

Figure 2:
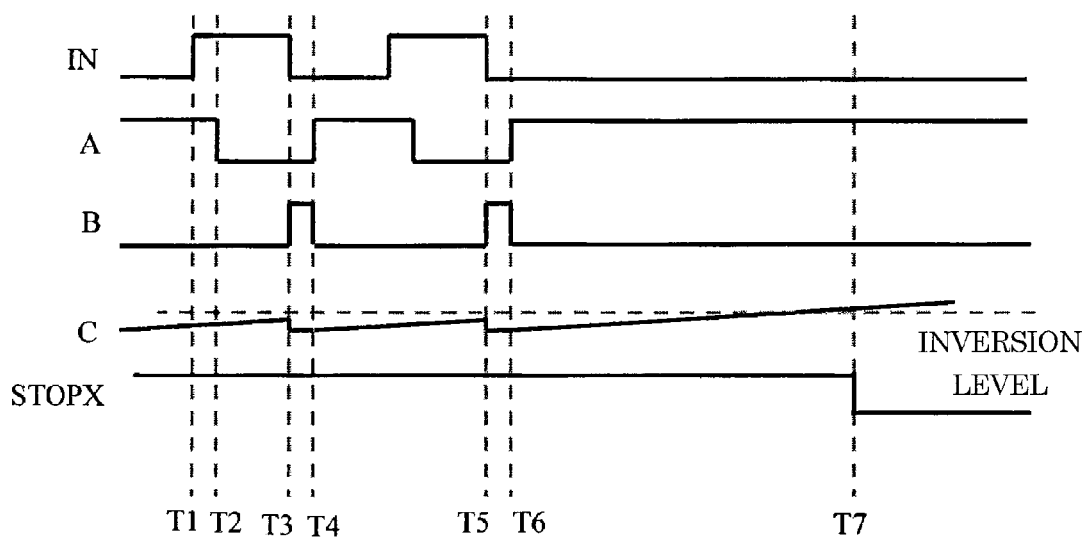
FIG. 2 is a timing chart illustrating an operation of the oscillation stop detection circuit according to the first embodiment of the present invention.

An operation of the oscillation stop detection circuit according to the first embodiment is described below. An oscillation signal IN is input to the input terminal 3, and a signal STOPX is output from the output terminal 7. A voltage Vref is input to the constant voltage terminal 4, and a signal TEST is input to the test terminals 5 and 6 similarly. FIG. 2 is a timing chart illustrating the operation of the oscillation stop detection circuit according to the first embodiment. At a time T1, when the oscillation signal IN becomes High, a delay is generated by the capacitor 41, and the node A becomes Low at a time T2 after the delay period. At a time T3, when the oscillation signal IN becomes Low, a delay is generated by the capacitor 41, and the node A becomes High at a time T4 after the delay period. Only in a period between the time T3 and the time T4 during which the oscillation signal IN and the node A are both Low, the node B becomes High to generate a one-shot pulse. When the node B is High, the NMOS transistor 20 is turned on to charge the capacitor 40, and then the node C is charged to a voltage VSS of the negative power supply terminal 2. The signal TEST is already set to Low, and hence, when the node B becomes Low, the capacitor 41 is discharged with a constant current generated by the constant voltage Vref and the PMOS transistor 30. In this manner, when the oscillation signal IN repeatedly becomes High and Low, the capacitor 40 is repeatedly charged and discharged, and hence the node C does not exceed an inversion level of the inverter 12, and the signal STOPX of High is output.

At a time T5, when the oscillation signal IN stops at Low, the node C is charged until a delay time T6 caused by the capacitor 41. However, the node B does not become High after the time T6, and hence the capacitor 41 continues to be discharged with the constant current supplied from the PMOS transistor 30. The voltage at the node C reaches a threshold voltage of the inverter 12, and the signal STOPX becomes Low at a time T7. In this manner, it can be detected that the oscillation signal IN has stopped oscillating. When the oscillation signal IN stops at High, after the delay caused by the capacitor 41, the node A remains Low, and the node B also remains Low. The node B is not High thereafter, and hence the capacitor 41 continues to be discharged with the constant current supplied from the PMOS transistor 30. The voltage at the node C reaches the threshold voltage of the inverter 12, and the signal STOPX becomes Low. In this manner, it can be detected that the oscillation has stopped, even when the oscillation signal IN has stopped at High. Further, the stop state can be reliably detected regardless of whether the oscillation signal IN stops in the High or Low state, and hence an oscillation stop detection period can be measured in both cases.

When the signal TEST becomes High in the state in which the oscillation signal IN stops oscillating, the node C forcibly becomes Low and the signal STOPX becomes High. When the signal TEST is set to Low in this state, constant current discharge is started by the PMOS transistor 30 to perform the same operation as that between the times T6 and T7 of FIG. 2, thus enabling an oscillation stop detection period to be measured. In this case, there is no period between the stop of original oscillation and the stop of the oscillation signal IN via a frequency divider stage, and hence the oscillation stop detection period can be measured more accurately.

In the period of charging the node C between the time T3 and the time T4, the node C is also discharged by the PMOS transistor 30, and hence a current is consumed in a path from the positive power supply terminal 1 to the negative power supply terminal 2 via the PMOS transistor 31, the PMOS transistor 30, the NMOS transistor 20, and the NMOS transistor of the inverter 11. However, the charge period is shorter than in the related art, and hence the current consumption can be reduced.

Note that, the pulse generation circuit is used for detecting the stop of oscillation in the above description, but the present invention is not limited to this configuration. Any configuration can be employed as long as the stop of oscillation can be detected regardless of whether the original oscillation stops at High or Low.

As described above, the oscillation stop detection circuit according to the first embodiment is capable of detecting the stop of oscillation regardless of whether the oscillation signal stops at High or Low and thereby measuring the oscillation stop detection period. Further, the period of charging the capacitor 40 is short, and hence the current consumption can be reduced.

Second Embodiment

Figure 3:
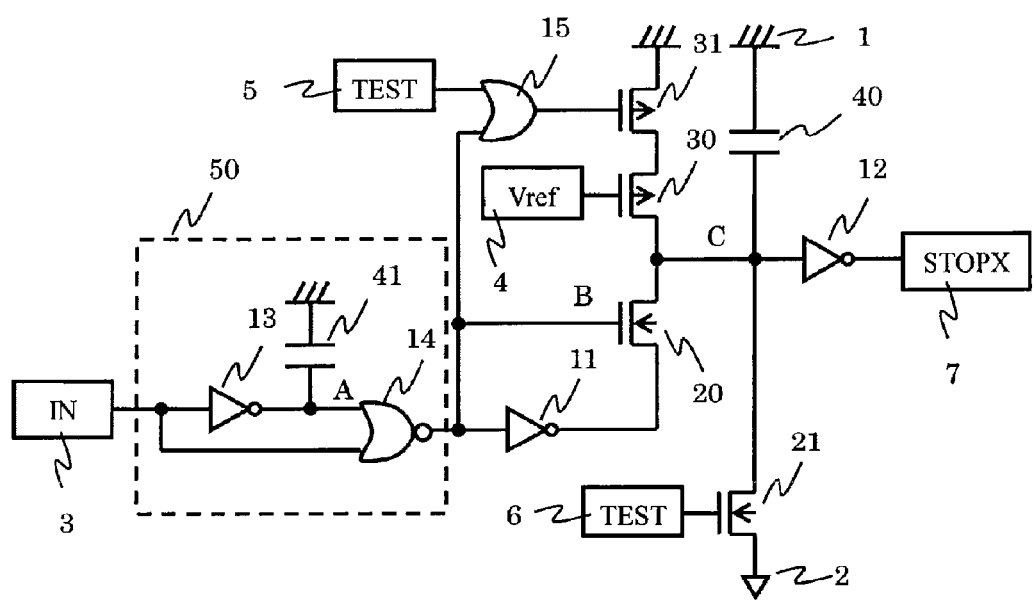
FIG. 3 is a circuit diagram of an oscillation stop detection circuit according to a second embodiment of the present invention.
Figure 4:
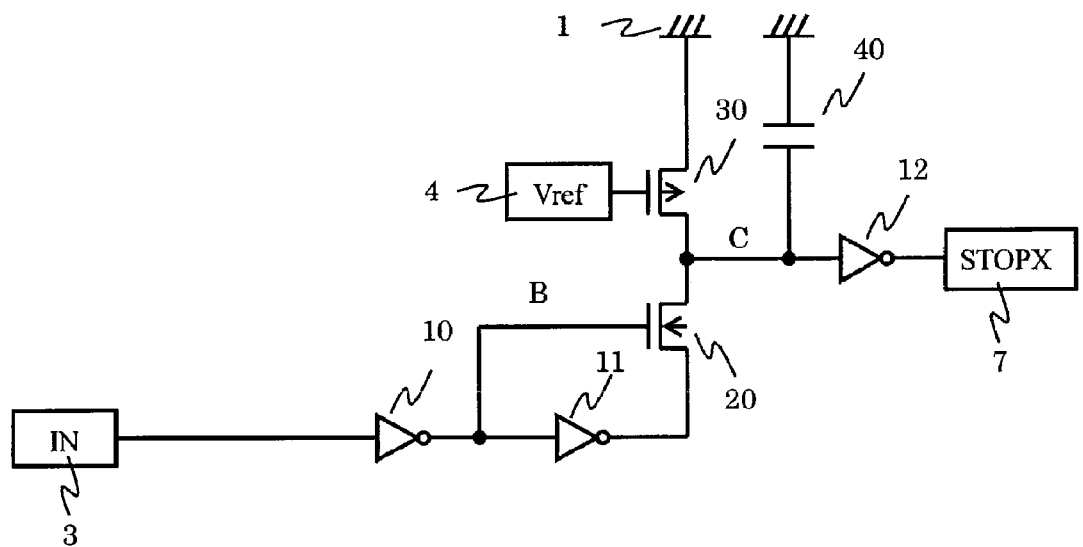
FIG. 4 is a circuit diagram of a related-art oscillation stop detection circuit.
Figure 5:
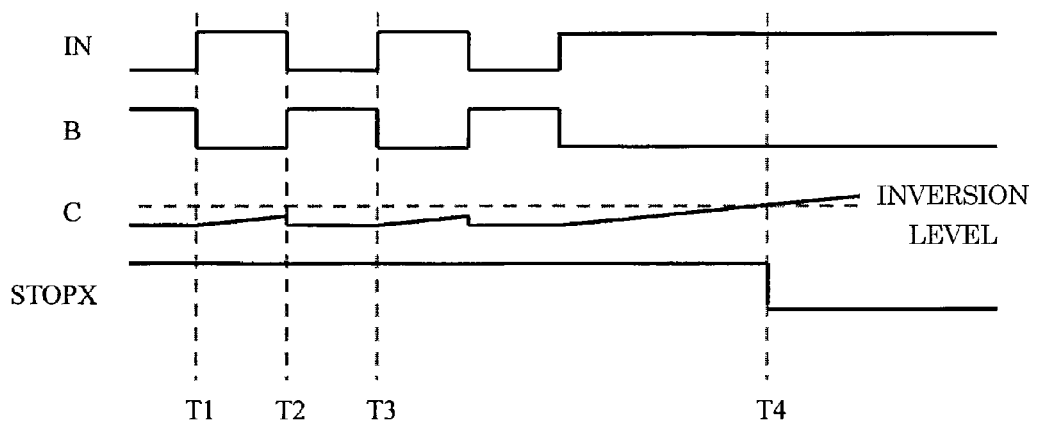
FIG. 5 is a timing chart illustrating an operation of the related-art oscillation stop detection circuit.

FIG. 3 is a circuit diagram illustrating an oscillation stop detection circuit according to a second embodiment of the present invention. The second embodiment is different from the first embodiment in that an OR circuit 15 is added. The OR circuit 15 has a first input connected to the test terminal 5, a second input connected to the output of the NOR circuit 14, and an output connected to the gate of the PMOS transistor 31. The other connections are the same as those in the first embodiment.

An operation of the oscillation stop detection circuit according to the second embodiment is described below. A timing chart of the oscillation stop detection circuit according to the second embodiment is the same as the timing chart of FIG. 2 for the oscillation stop detection circuit according to the first embodiment. At the time T3, when the node B becomes High, the NMOS transistor 20 is turned on to start the charge of the capacitor 40. Further, the output of the OR circuit 15 becomes High to turn off the PMOS transistor 31.

In this manner, the PMOS transistor 31 is turned off until the time T4. Consequently, during the charge period of the capacitor 40, a current can be prevented from flowing from the positive power supply terminal 1 to reduce current consumption. The other operations are the same as those in the first embodiment.

Note that, the pulse generation circuit is used for detecting the stop of oscillation in the above description, but the present invention is not limited to this configuration. Any configuration can be employed as long as the stop of oscillation can be detected regardless of whether the original oscillation stops at High or Low. Further, the OR circuit 15 and the PMOS transistor 31 are used for reducing the current consumption in the above description, but the present invention is not limited to this configuration. Any configuration can be employed as long as the current consumption can be reduced.

As described above, the oscillation stop detection circuit according to the second embodiment is capable of detecting the stop of oscillation regardless of whether the oscillation signal stops at High or Low and thereby measuring the oscillation stop detection period. Further, during the charge period of the capacitor 40, a current can be prevented from flowing from the positive power supply terminal 1 to reduce the current consumption.

Note that, the oscillation stop detection circuit according to the present invention is used in an electronic device including a built-in oscillation circuit, such as an electronic watch that requires lower current consumption. The oscillation stop detection circuit is low in current consumption and is capable of accurately detecting the stop of oscillation of the oscillation circuit, and hence the electronic device can operate stably with low current consumption.

What is claimed is:

1. An oscillation stop detection circuit comprising:
   an input terminal;
   an output terminal;
   a first power supply terminal;
   a second power supply terminal;
   a pulse generation circuit that outputs a one-shot pulse in synchronization with an oscillation signal input from the input terminal;
   a capacitor including a first terminal connected to the first power supply terminal and a second terminal connected to the output terminal;
   a constant current circuit connected to the first power supply terminal and to the second terminal of the capacitor; and
   a first switch circuit including a transistor and an inverter, the first switch circuit connected between an output terminal of the pulse generation circuit and the second terminal of the capacitor, and charging the second terminal of the capacitor through the inverter and the transistor based on the one-shot pulse.

2. An oscillation stop detection circuit according to claim 1, further comprising a second switch circuit connected between the first power supply terminal and the constant current circuit, wherein, when the first switch circuit is turned on, the second switch circuit is turned off.

3. An electronic device, comprising:
   an oscillation circuit; and
   the oscillation stop detection circuit according to claim 1, for detecting that an oscillation signal output from the oscillation circuit stops oscillating.

\* \* \* \* \*